(12) United States Patent
Kyoh et al.

(10) Patent No.: US 7,966,584 B2
(45) Date of Patent: *Jun. 21, 2011

(54) PATTERN-PRODUCING METHOD FOR SEMICONDUCTOR DEVICE

(75) Inventors: Suigen Kyoh, Yokohama (JP); Toshiya Kotani, Machida (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

This patent is subject to a terminal disclaimer.

(21) Appl. No.: 12/385,454

(22) Filed: Apr. 8, 2009

(65) Prior Publication Data

US 2009/0199148 A1 Aug. 6, 2009

Related U.S. Application Data

(63) Continuation of application No. 11/012,492, filed on Dec. 16, 2004, now Pat. No. 7,523,437.

(30) Foreign Application Priority Data

Dec. 18, 2003 (JP) ................................. 2003-420984

(51) Int. Cl.
   *G06F 17/50* (2006.01)
(52) U.S. Cl. .......................................... 716/53; 430/30
(58) Field of Classification Search ........................ None
   See application file for complete search history.

(56) References Cited

U.S. PATENT DOCUMENTS

| | | | |
|---|---|---|---|
| 6,415,421 B2 | 7/2002 | Anderson et al. | |
| 6,453,274 B2 | 9/2002 | Kamon | |
| 6,470,489 B1 | 10/2002 | Chang et al. | |
| 6,510,730 B1 | 1/2003 | Phan et al. | |
| 6,578,190 B2 | 6/2003 | Ferguson et al. | |
| 6,584,609 B1 | 6/2003 | Pierrat et al. | |
| 6,907,596 B2 | 6/2005 | Kobayashi et al. | |
| 7,043,712 B2 | 5/2006 | Mukherjee et al. | |
| 7,313,508 B2 | 12/2007 | Croffie et al. | |
| 2003/0177465 A1 | 9/2003 | MacLean et al. | |

FOREIGN PATENT DOCUMENTS

| | | |
|---|---|---|
| JP | 09-212543 | 8/1997 |
| JP | 2000-314954 | 11/2000 |
| JP | 2001-297126 | 10/2001 |
| JP | 2001-350250 | 12/2001 |
| JP | 2001-356465 | 12/2001 |
| JP | 2002-026126 | 1/2002 |
| JP | 2003-303742 | 10/2003 |
| KR | 2001-0110074 | 12/2001 |

OTHER PUBLICATIONS

Gueheneuc et al., "Using Design Patterns and Constraints to Automate the Detection and Correction of Inter-class Design Defects," 2001 IEEE, pp. 296-305.*

(Continued)

*Primary Examiner* — Leigh Marie Garbowski
(74) *Attorney, Agent, or Firm* — Finnegan, Henderson, Farabow, Garrett & Dunner, L.L.P.

(57) ABSTRACT

Disclosed is a method of producing a pattern for a semiconductor device, comprising extracting part of a pattern layout, perturbing a pattern included in the part of the pattern layout to generate a perturbation pattern, correcting the perturbation pattern, predicting a first pattern, to be formed on a wafer, from the corrected perturbation pattern, acquiring a first difference between the perturbation pattern and the first pattern, and storing information concerning the perturbation pattern including information concerning the first difference.

10 Claims, 8 Drawing Sheets

OTHER PUBLICATIONS

Notice of Reasons for Rejection mailed Mar. 25, 2008, issued by the Japanese Patent Office for Application No. 2003-420984, and English translation thereof.

Notification for Filing Opinion mailed Apr. 17, 2006, issued by the Korean Intellectual Property Office in counterpart Korean Application No. 10-2004-106850 and English translation thereof.

* cited by examiner

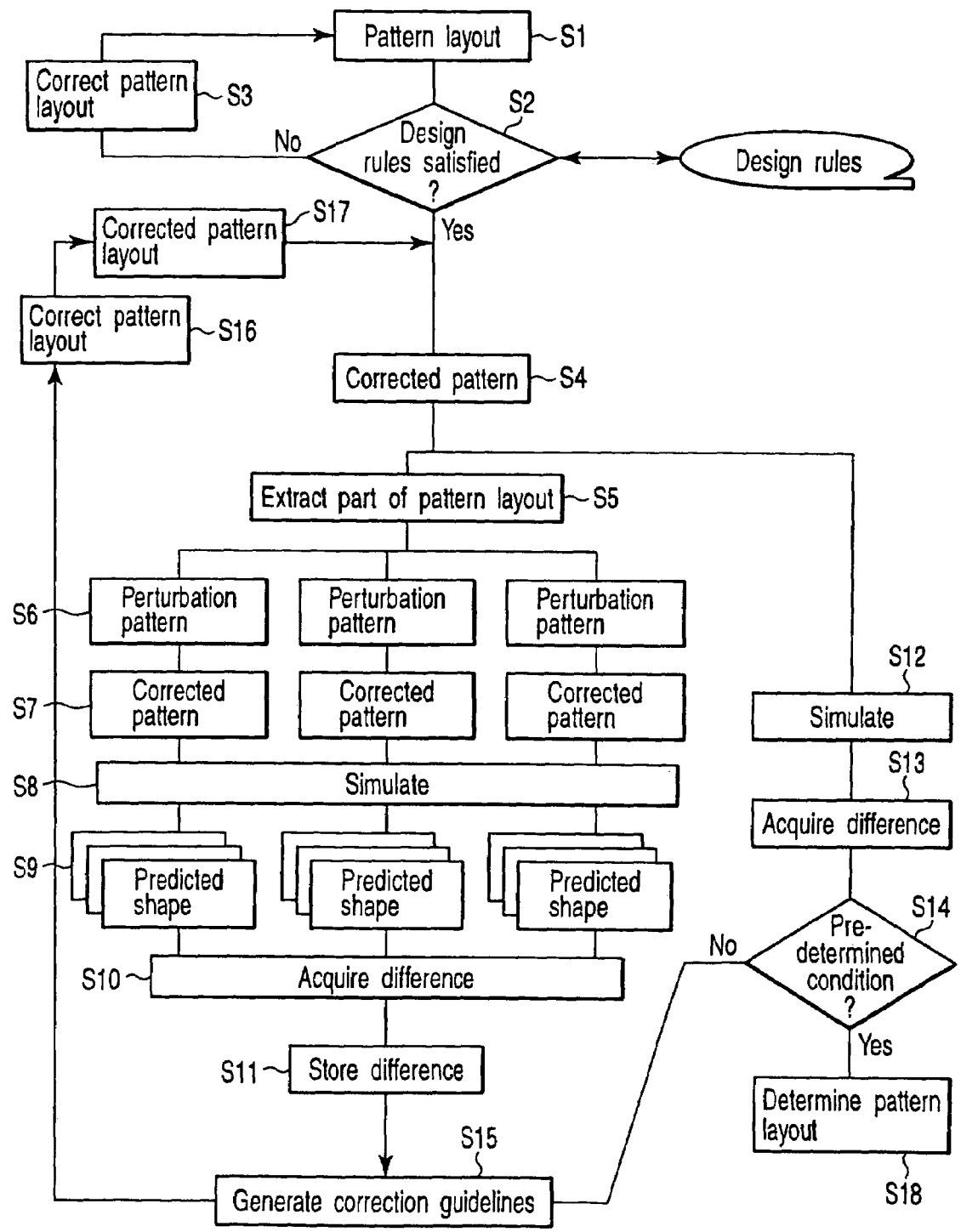
F I G. 1

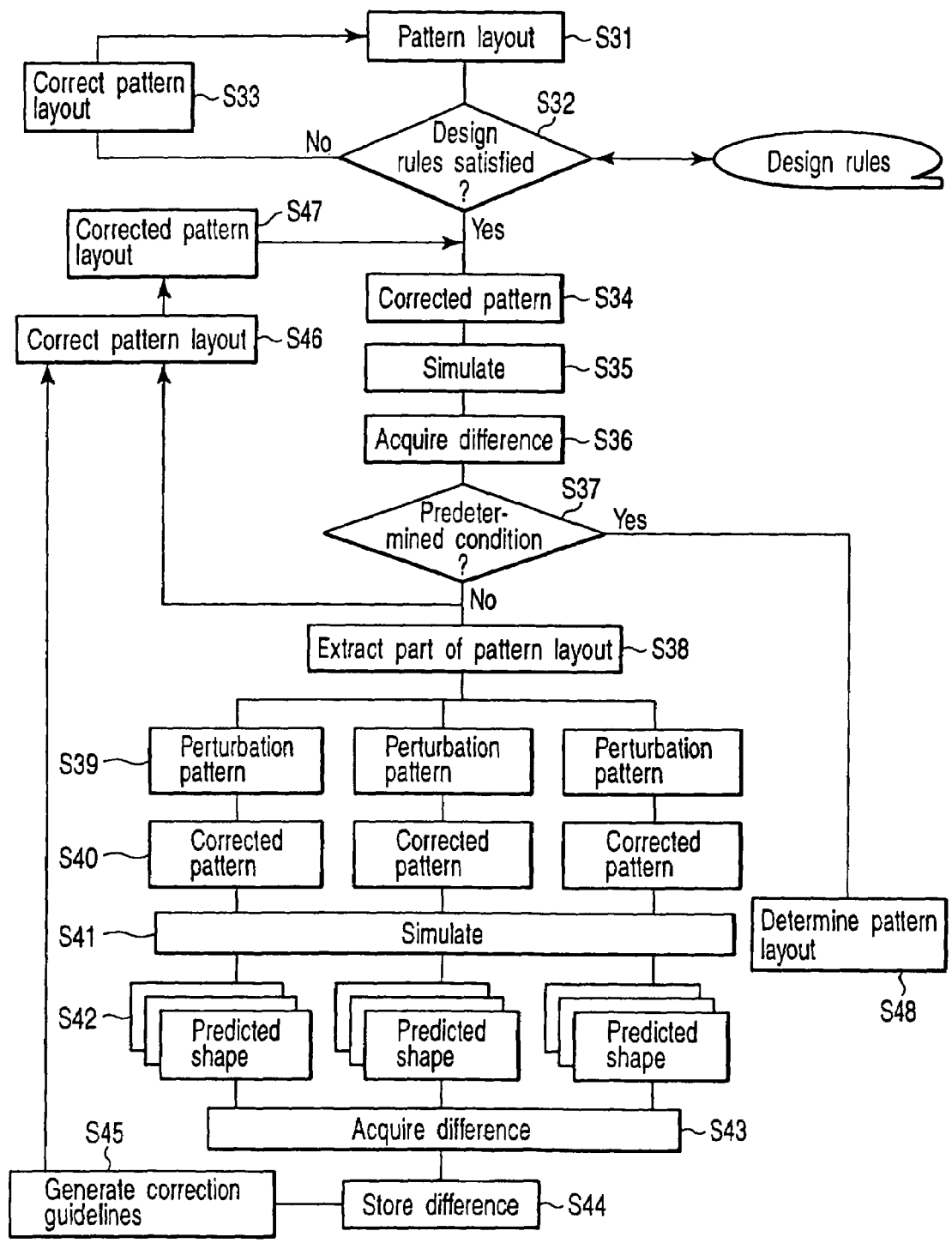
F I G. 8

PATTERN-PRODUCING METHOD FOR SEMICONDUCTOR DEVICE

CROSS-REFERENCE TO RELATED APPLICATIONS

This application is a continuation of application Ser. No. 11/012,492, filed Dec. 16, 2004, now U.S. Pat. No. 7,523,437 and claims the benefit of priority from prior Japanese Patent Application No. 2003-420984, filed Dec. 18, 2003, the entire contents of both which are incorporated herein by reference.

BACKGROUND OF THE INVENTION

1. Field of the Invention

The present invention relates to, for example, a pattern-producing method for semiconductor devices.

2. Description of the Related Art

In accordance with the development of microfabrication of semiconductor devices, it has been difficult to form a pattern on a semiconductor substrate as designed. In light of this, Jpn. Pat. Appln. KOKAI Publication No. 2002-26126 and U.S. Pat. Nos. 6,415,421 and 6,470,489, for example, disclose the following pattern-producing method.

Firstly, it is determined whether a pattern layout satisfies the preset design rules. If the pattern layout does not satisfy the rules, it is repeatedly corrected until it satisfies them. Subsequently, the thus-obtained pattern layout is subjected to predetermined correction such as proximity correction, thereby producing a corrected pattern. After that, in consideration of the predetermined error factor such as the proximity effect, the processed pattern shape on the semiconductor substrate is predicted from the corrected pattern. Further, the processed pattern shape is compared with the pattern included in the pattern layout, thereby determining whether a predetermined condition is satisfied. If this condition is not satisfied, the pattern layout is corrected repeatedly in the above-described manner until the predetermined condition is satisfied.

Since, however, conventional pattern correction is performed by trial and error mainly based on the experience of the designer, it requires a lot of time and effort. Therefore, in accordance with the development of microfabrication of patterns, the time and effort required for conventional correction of pattern layouts will be more and more increased.

As stated above, in the prior art, a lot of time and effort is required which makes it difficult to form a desired pattern easily.

BRIEF SUMMARY OF THE INVENTION

According to a first aspect of the present invention, there is provided a method of producing a pattern for a semiconductor device, comprising: extracting part of a pattern layout; perturbing a pattern included in the part of the pattern layout to generate a perturbation pattern; correcting the perturbation pattern; predicting a first pattern, to be formed on a wafer, from the corrected perturbation pattern; acquiring a first difference between the perturbation pattern and the first pattern; and storing information concerning the perturbation pattern including information concerning the first difference.

According to a second aspect of the present invention, there is provided a computer readable medium configured to store program instructions, used for producing a pattern for a semiconductor device, for causing a computer to extract part of a pattern layout; causing the computer to perturb a pattern included in the part of the pattern layout to generate a perturbation pattern; causing the computer to correct the perturbation pattern; causing the computer to predict a first pattern, to be formed on a wafer, from the corrected perturbation pattern; causing the computer to acquire a first difference between the perturbation pattern and the first pattern; and causing the computer to store information concerning the perturbation pattern including information concerning the first difference.

BRIEF DESCRIPTION OF THE SEVERAL VIEWS OF THE DRAWING

FIG. 1 is a flowchart useful in explaining a method according to a first embodiment of the invention;

FIG. 8 is a flowchart useful in explaining a method according to a second embodiment of the invention;

DETAILED DESCRIPTION OF THE INVENTION

Embodiments of the invention will be described in detail with reference to the accompanying drawings.

First Embodiment

FIG. 1 is a flowchart useful in explaining a method according to a first embodiment of the invention.

Firstly, a pattern layout for a semiconductor integrated circuit is prepared (S1), and it is determined whether the pattern layout satisfies preset design rules (S2). If it does not satisfy the rules, it is repeatedly corrected until it satisfies them (S3). Since it is assumed that the pattern layout is modified at a later step, simple design rules should be set instead of complex ones.

Subsequently, the layout pattern that satisfies the design rules is subjected to predetermined correction, such as optical proximity correction or process proximity correction, thereby forming a mask pattern thus corrected (S4). The resultant mask pattern is not an actually one formed on a mask substrate, but a virtual one formed by a computer. After that, the following two processes are performed.

In the first process, correction guidelines used to correct a pattern layout are generated.

Figure 2:
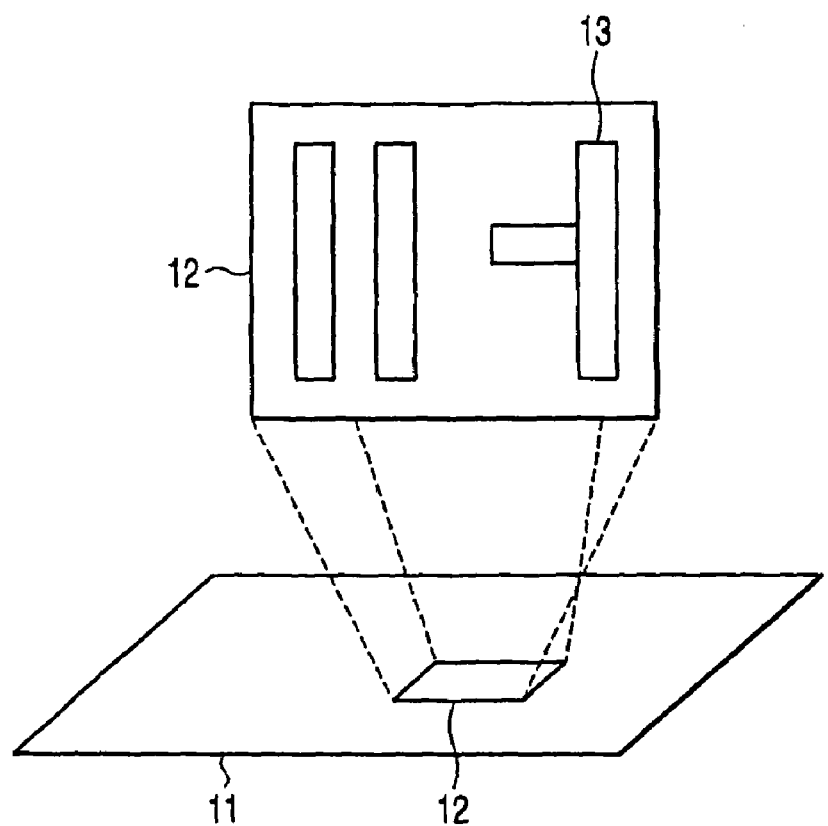
FIG. 2 is a view illustrating a region extracted from a pattern layout employed in the embodiment.
Figure 3:
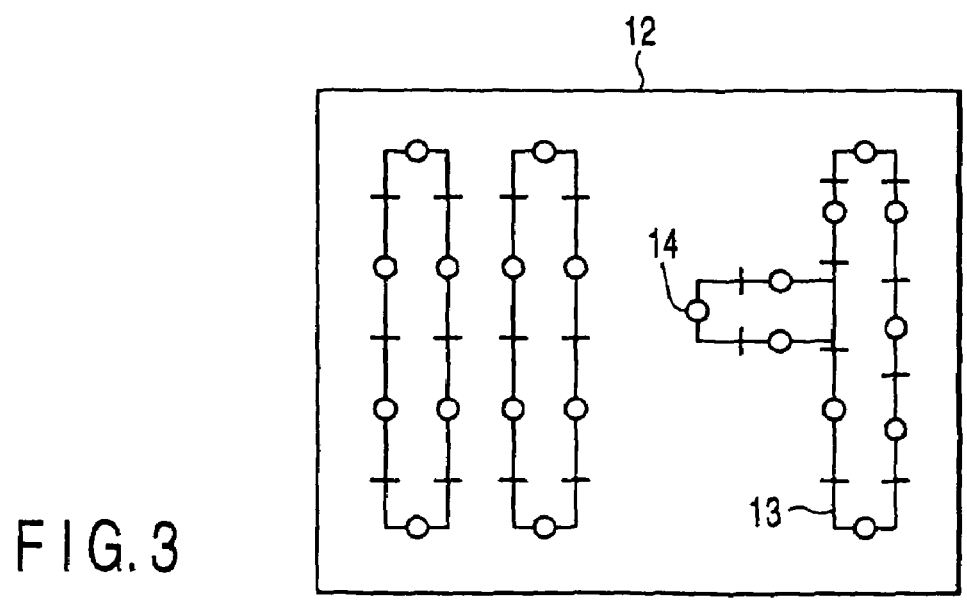
FIG. 3 is a view illustrating an example of a typical point employed in the embodiment.

Firstly, as shown in FIG. 2, a region (certain region) 12 is extracted from a pattern layout 11 (S5). That is, part of the pattern layout is extracted. In general, a plurality of regions (parts) 12 are extracted from the pattern layout 11, and are each subjected to the following process. Perturbation is imparted to a pattern 13 included in each extracted region, thereby generating a plurality of perturbation patterns. For instance, as shown in FIG. 3, the peripheral line (outline) of the pattern 13 is divided into a plurality of line segments, and a typical point 14 is set on each line segment. The typical point 14 and each line segment are moved together, thereby forming a perturbation pattern (S6). Subsequently, each perturbation pattern is subjected to predetermined correction, such as optical proximity correction or process proximity correction, thereby forming a plurality of corrected patterns (virtual, corrected mask patterns formed by a computer) subjected to the predetermined correction (S7). After that, from the corrected patterns acquired at step S7, a processed pattern shape (prediction shape) on a wafer is predicted by simulation, in consideration of a predetermined error factor in a manufacture process, such as an optical proximity effect or process proximity effect. This simulation is performed by changing process conditions for an exposure process and etching process, etc. within predetermined process error ranges. Accordingly, for each corrected pattern, a plurality of processed pattern shapes corresponding to the process conditions are predicted (S8, S9).

A description will now be given of several process examples performed at steps S5-S9.

Figure 4:
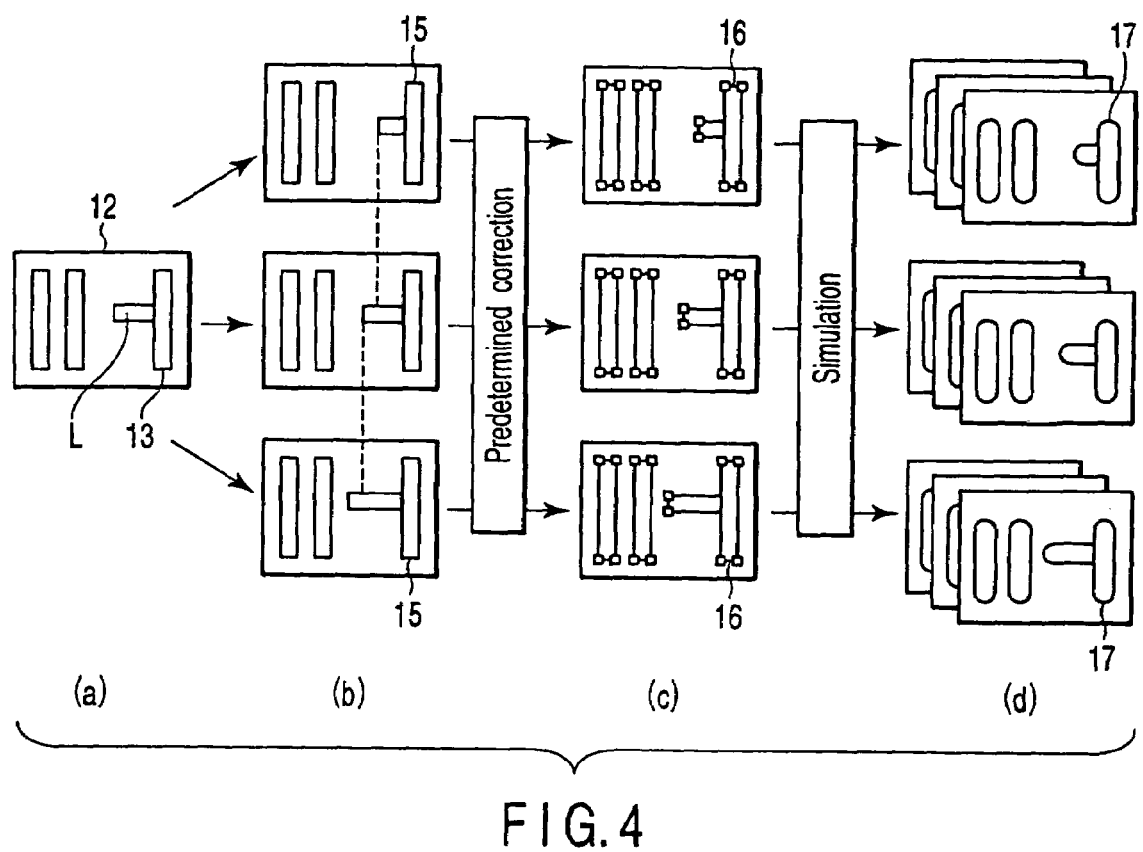
FIGS. 4(a)-4(d) are views useful in explaining part of the method of the embodiment.

Referring first to FIG. 4, a first example will be described. Firstly, as shown in (a) of FIG. 4, a region 12 is extracted from a pattern layout. Subsequently, perturbation is imparted to a pattern 13 included in the extracted region, thereby generating a plurality of perturbation patterns 15 as shown in (b) of FIG. 4. Specifically, the peripheral line of the pattern 13 is divided into a plurality of line segments, and a particular line segment L included in the segments is perturbed (actually, a typical point on the line segment L is moved), thereby forming a plurality of perturbation patterns 15. Actually, perturbation is imparted to a particular pattern portion including the line segment L to laterally expand or contract. Subsequently, the thus-acquired perturbation patterns 15 are subjected to predetermined correction, such as optical proximity correction or process proximity correction, thereby generating a plurality of corrected patterns 16 as shown in (c) of FIG. 4. Further, simulation is performed in consideration of a predetermined error factor, such as an optical proximity effect or process proximity effect, thereby predicting the processed pattern shape 17 on a wafer, as is shown in (d) of FIG. 4.

Figure 5:
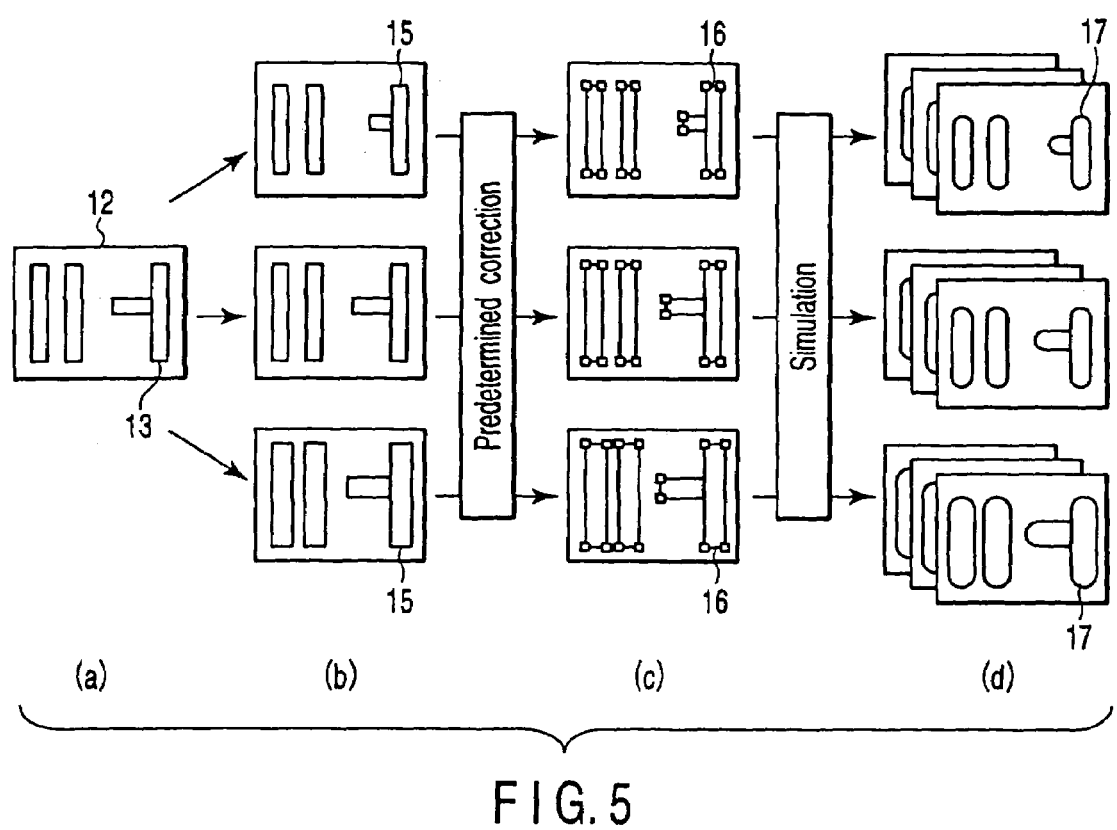
FIGS. 5(a)-5(d) are views useful in explaining part of the method of the embodiment.

Referring then to FIG. 5, a second example will be described. Firstly, as shown in (a) of FIG. 5, a region 12 is extracted from a pattern layout. Subsequently, perturbation is imparted to a pattern 13 included in the extracted region, thereby generating a plurality of perturbation patterns 15 as shown in (b) of FIG. 5. Actually, perturbation is imparted to a pattern included in the region 12 to uniformly expand or contract, thereby generating the plurality of perturbation patterns 15. More specifically, the peripheral line of the pattern 13 is divided into a plurality of line segments, and the plurality of line segments and their respective typical points are moved, which is the meaning of the perturbation. Subsequently, the thus-acquired perturbation patterns 15 are subjected to predetermined correction, such as optical proximity correction or process proximity correction, thereby forming a plurality of corrected patterns 16 as shown in (c) of FIG. 5. Further, simulation is performed in consideration of a predetermined error factor, such as an optical proximity effect or process proximity effect, thereby predicting the processed pattern shape 17 on a wafer, as is shown in (d) of FIG. 5.

Figure 6:
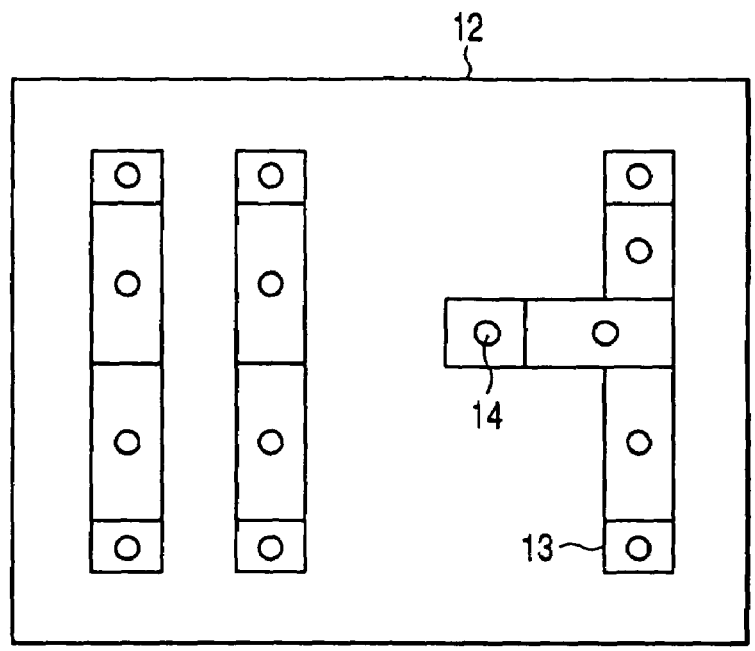
FIG. 6 is a view illustrating another example of the typical point employed in the embodiment.

Referring to FIG. 6, a third example will be described. In the above-described first and second examples, a typical point 14 is set on each line segment acquired by dividing the peripheral line of the pattern 13. In contrast, in the third example, a pattern included in the region 12 is divided into a plurality of portions (e.g., polygonal portions such as rectangular portions), and a typical point is set in each portion as shown in FIG. 6. Each typical point is set at, for example, the center of gravity of each portion. Particular ones of the portions are moved (actually, their typical points are also moved), thereby generating a plurality of perturbation patterns. If particular portions are moved away from the other portions to thereby form gaps therebetween, processing for automatically filling the gaps is performed. The processes performed after generating perturbation patterns are similar to those performed in the first and second examples.

Thus, processed pattern shapes are predicted by simulation. After that, the shape of the perturbation pattern acquired at step S6 is compared with the processed pattern shape predicted at step S9, and the difference therebetween (for example, the amount of deviation therebetween) is acquired. Specifically, concerning each perturbed typical point, the difference between the pattern shapes is detected (S10). The thus-acquired information on the difference is stored in a storing unit as information related to perturbation patterns, together with information concerning the position of each perturbation pattern (e.g., the position of the typical point of each perturbation pattern), the direction of perturbation (e.g., the perturbation direction of each typical point) and the amount of perturbation (e.g., the perturbation amount of each typical point). As a result, a database concerning the information is produced (S11).

The second process performed after step S4 will be described.

In the second process, firstly, a processed pattern shape on a wafer is predicted by simulation from the corrected pattern acquired at step S4, in consideration of a predetermined error factor in a manufacture process, such as an optical proximity effect or process proximity effect. This simulation is performed by changing process conditions for an exposure process and etching process, etc. within predetermined process error ranges. Accordingly, for each corrected pattern, a plurality of processed pattern shapes corresponding to the process conditions are predicted (S12). Subsequently, the pattern shape of the pattern layout currently set is compared with the processed pattern shape predicted at step S12, and the difference therebetween (for example, the amount of deviation therebetween) is acquired (S13). Further, it is determined whether the thus-acquired difference satisfies a predetermined condition. For example, it is determined whether the difference between the pattern shape of the pattern layout and the predicted processed pattern shape falls within a predetermined range in the entire region of pattern layout (S14).

If it is determined that the difference does not satisfy the predetermined condition, correction guidelines concerning the pattern layout are generated at step S15 to cause the difference to satisfy the predetermined condition, referring to the information related to the perturbation patterns stored at step S11. Based on the correction guidelines, the pattern layout is corrected (S16), and the corrected pattern layout is generated (S17). The above-described steps S4-S17 are executed again on the corrected pattern layout. On the other hand, if it is determined that the difference satisfies the predetermined condition at step S14, the pattern layout currently set is determined to be a fixed one (S18). Based on the thus-determined pattern layout, a mask pattern is formed on a mask substrate.

As described above, in the first embodiment, part of a currently set pattern layout is extracted, a pattern included in the extracted part is perturbed to generate a perturbation pattern, and information (related to the perturbation pattern) acquired by simulation using the perturbation patterns is stored in a storing unit. The information related to the perturbation pattern is accumulated as a database, and used as correction guideline for correcting (modifying) pattern layout. As a result, pattern layout correction can be performed easily in a short time. In other words, even an inexperienced designer can correct a pattern layout in a short time, referring to the correction guidelines. Further, the pattern layout can be automatically corrected by a migration tool. In this case, steps S4-S17 shown in FIG. 1 are automatically executed.

The procedure (in particular, steps S5-S11) of the above-described method of the first embodiment can be realized by a computer controlled by a program describing the procedure. This program can be acquired from a recording medium such as a magnetic disk, or a communication line (wired or wireless line) such as the Internet.

Figure 7:
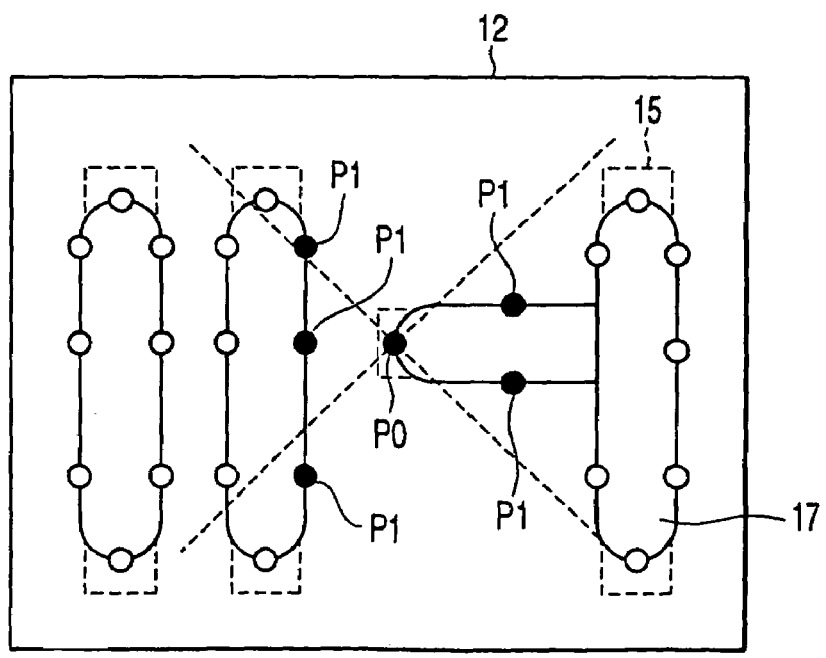
FIG. 7 is a view useful in explaining an example of a manner of acquiring the difference between a perturbation pattern and predicted pattern shape, employed in the embodiment.

In the first embodiment, the difference between a perturbation pattern and a predicted pattern is acquired concerning a perturbed typical point at step S10 shown in FIG. 1. However, the differences concerning typical points located near the perturbed one may also be acquired. FIG. 7 shows an example of this case. In FIG. 7, black circles indicate typical points, the differences concerning which are detected, and white circles indicate typical points, the differences concerning which are not detected. P0 indicates a particular typical point that has been perturbed, while P1 indicates a typical point located near P0. In the case of FIG. 7, the portion around P0 is divided into four regions, and the typical point closest to P0 in each region is set as P1.

As described above, the difference between a perturbation pattern and predicted pattern concerning a portion near a perturbed portion is also detected and stored, in addition to the difference concerning the perturbed portion. As a result, the influence of a perturbed portion upon other portions can be estimated, which enables pattern layout correction to be performed more accurately.

Further, in the above-described first embodiment, at step S14 in FIG. 1, it is determined whether the difference acquired at step S13 is not more than a predetermined value (i.e., whether the difference satisfies a predetermined condition), and if the difference is more than the predetermined value, pattern layout correction is performed. Alternatively, even if the difference acquired at step S13 is not more than the predetermined value, if a certain condition is satisfied, it may be determined not to satisfy the predetermined condition, thereby performing pattern layout correction. Specifically, a portion at which the difference is not more than the predetermined value is extracted from a pattern layout, and it is determined whether the pattern layout at the extracted portion can be contracted. If such a correction is possible, it is determined at step S14 that the difference acquired at step S13 does not satisfy the predetermined condition, and pattern layout correction is performed at step S16 in accordance with correction guidelines generated at step S15.

As described above, even if the difference is not more than the predetermined value, the area of the pattern layout can be reduced by correcting the pattern layout providing that a certain condition is satisfied. In particular, if this method is applied to a pattern on a critical path, the pattern layout can be efficiently reduced.

Second Embodiment

FIG. 8 is a flowchart useful in explaining a method according to a second embodiment of the invention. The method of the second embodiment is basically similar to that of the first embodiment, and no description is given of the matters described in the first embodiment.

Firstly, like steps S1-S4 in FIG. 1, steps S31-S34 are executed. Subsequently, like step S12 in FIG. 1, processed pattern shapes on a wafer are predicted by simulation (S35). After that, like step S13 in FIG. 1, the difference between the pattern shape of a pattern layout currently set and the processed pattern shape predicted at step S35 is detected (S36). Furthermore, like step S14 in FIG. 1, it is determined whether the detected difference satisfies a predetermined condition (S37).

If it is determined that the difference does not satisfy the predetermined condition, a region, which corresponds to a portion in which the difference between the pattern included in the pattern layout set currently and the pattern predicted at step S35 is not less than a predetermined value, is set as a certain region, and this certain region is extracted from the pattern layout (S38). The extracted region is subjected to steps S39-S44 corresponding to steps S6-S11 in FIG. 1.

Thereafter, like steps S15-S17 in FIG. 1, steps S45-S47 are executed, thereby correcting the pattern layout. The corrected pattern layout is subjected to steps S34-S47. If it is determined at step S37 that the predetermined condition is satisfied, the pattern layout currently set is determined as the fixed pattern layout (S48).

As described above, the second embodiment can provide the same advantage as the first embodiment, i.e., can perform pattern layout correction easily in a short time. Further, in the second embodiment, a region, which corresponds to a portion in which the difference between the pattern included in the pattern layout and the predicted processed pattern shape is not less than a predetermined value, is set as a certain region and subjected to steps S39-44. This differs from the first embodiment in which all regions estimated necessary for generating correction guidelines are extracted as certain regions and subjected to steps S6-S11. In other words, in the second embodiment, it is sufficient if steps S39-S44 are executed on only the region corresponding to the portion in which the above-mentioned difference is not less than a predetermined value, therefore the time required for processing can be significantly reduced.

The procedure (in particular, steps S38-S44) of the above-described method of the second embodiment can be realized by a computer controlled by a program describing the procedure. This program can be acquired from a recording medium such as a magnetic disk, or a communication line (wired or wireless line) such as the Internet.

Third Embodiment

Figure 9:
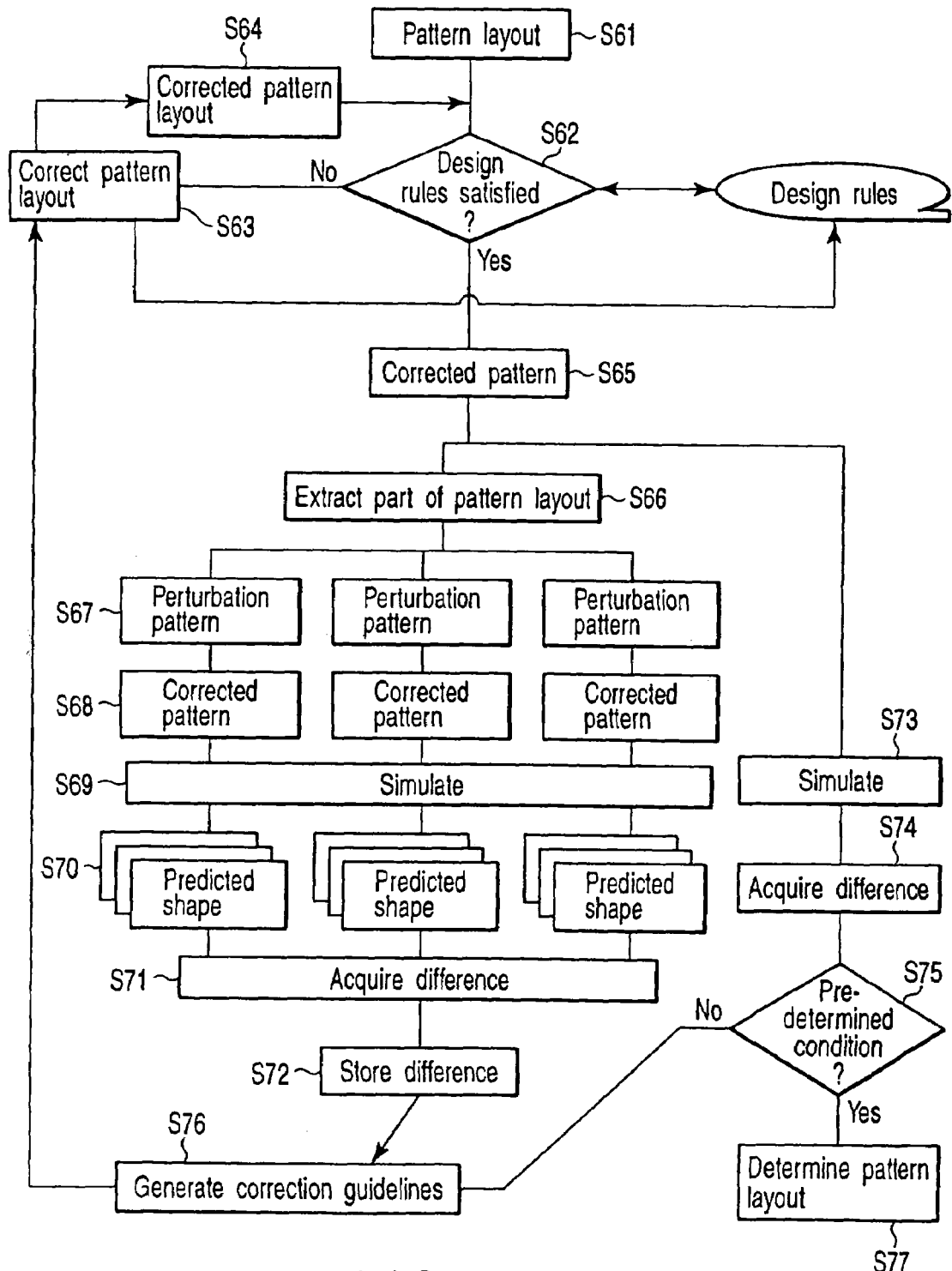
FIG. 9 is a flowchart useful in explaining a method according to a third embodiment of the invention.

FIG. 9 is a flowchart useful in explaining a method according to a third embodiment of the invention. The method of the third embodiment is basically similar to that of the first embodiment, and no description is given of the matters described in the first embodiment.

Firstly, like steps S1-S3 in FIG. 1, steps S61-S63 are executed, thereby generating a corrected pattern layout (S64). Until the pattern layout satisfies the preset design rules, pattern layout correction is repeated. Further, like step S4 in FIG. 1, step S65 is executed, thereby generating a corrected mask pattern.

Subsequently, like steps S5-S11 in FIG. 1, steps S66-S72 are executed. Further, like steps S12-S14 in FIG. 1, steps S73-S75 are executed. Further, like steps S15-S17 in FIG. 1, a corrected pattern layout is produced (S76, S63, S64).

In the third embodiment, however, information concerning the correction guidelines generated at step S76 is reflected in the design rules, i.e., the design rules are corrected. Furthermore, it is determined whether the corrected pattern layout satisfies the design rules. The corrected pattern layout does not always satisfy the design rules. Therefore, it may be determined that the corrected portion does not satisfy the design rules. Therefore, it is assumed that the design rules are ignored concerning the corrected portion, and that it is sufficient if the corrected portion accords with the correction guidelines. As in the first embodiment, simple design rules are employed instead of complex ones, therefore it is more suitable for production of an appropriate pattern layout to regard, as important, the correction guidelines acquired from an actual pattern layout by simulation, than to regard the design rules as important. No problem will occur if the design rules are ignored concerning the corrected portion.

If the above-described steps are executed, and if it is determined at step S75 that the predetermined condition is satisfied, the pattern layout currently set is determined as the fixed pattern layout (S77).

As described above, the third embodiment can also provide the same advantage as the first embodiment, i.e., can perform pattern layout correction easily in a short time. Furthermore, since the third embodiment reflects information concerning correction guidelines in the design rules, it can perform accurate pattern layout correction.

The procedure (in particular, steps S66-S72) of the above-described method of the third embodiment can be realized by a computer controlled by a program describing the procedure. This program can be acquired from a recording medium such as a magnetic disk, or a communication line (wired or wireless line) such as the Internet.

Figure 10:
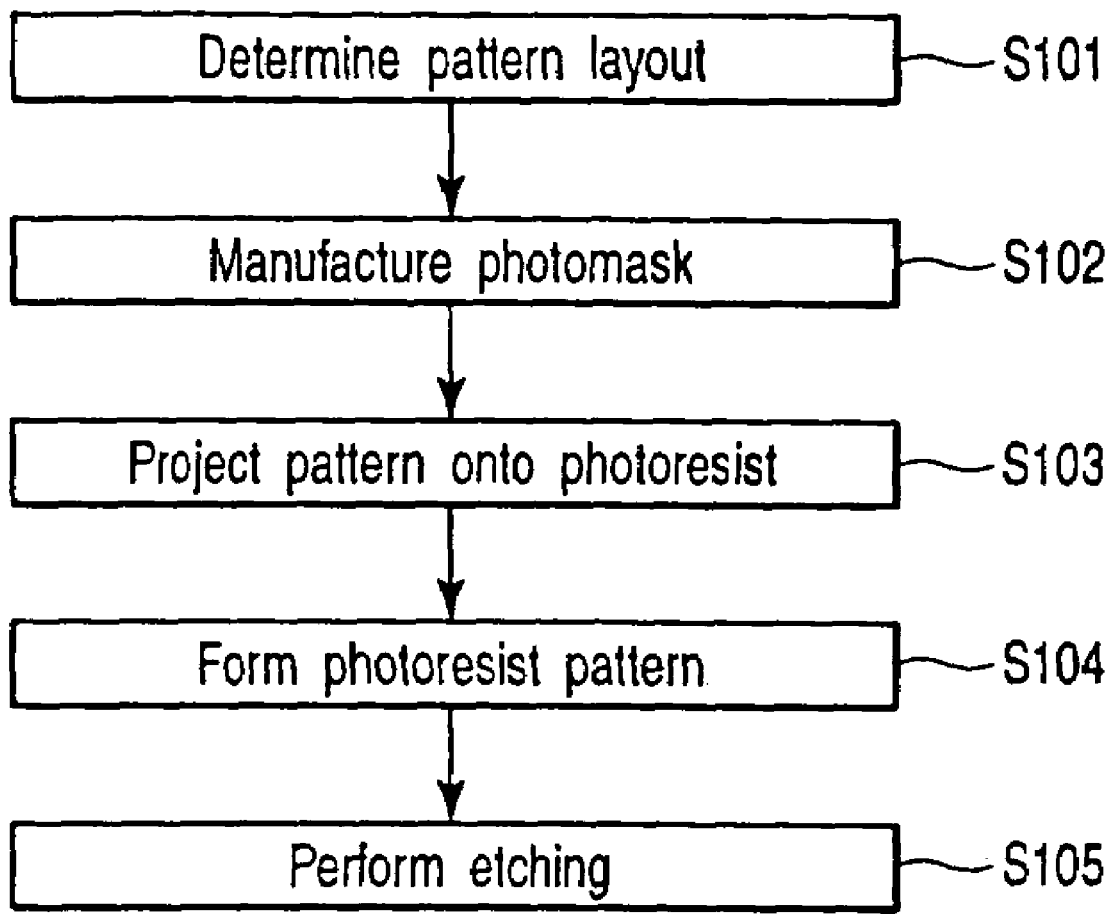
FIG. 10 is a flowchart illustrating a mask manufacturing method and semiconductor device manufacturing method related to the embodiment of the invention.

A mask pattern, which is based on the pattern layout finally determined by the method of the first, second or third embodiment, is formed on a mask substrate, thereby producing a photomask. Using the mask pattern on the mask substrate, a semiconductor device (semiconductor integrated circuit) is produced. FIG. 10 is a flowchart illustrating a process for producing a semiconductor device.

Specifically, a fixed pattern layout is determined by the method according to the first, second or third embodiment (S101). Subsequently, a mask pattern is formed on a mask substrate based on the determined pattern layout, thereby forming a photomask (S102). The mask pattern on the photomask is projected onto a photoresist on a wafer (semiconductor substrate) (S103), and the photoresist is developed using a developer, thereby forming a photoresist pattern (S104). Using the photoresist pattern as a mask, a conductive film, insulation film, etc. on the semiconductor substrate are etched into a desired pattern (S105).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a pattern, comprising:
   extracting, by a computer, part of a pattern layout of a design pattern of a semiconductor device;
   perturbing, by a computer, a pattern included in said part of the pattern layout by moving an edge of said pattern to generate a plurality of perturbation patterns;
   correcting, by a computer, each of the perturbation patterns;
   predicting, by a computer, first patterns, to be formed on a wafer, from the corrected perturbation patterns;
   acquiring, by a computer, first differences between the perturbation patterns and the first patterns; and
   correcting, by a computer, the pattern included in said part of the pattern layout based on one of the perturbation patterns that satisfies a predetermined condition concerning the first differences.

2. The method according to claim 1, wherein correcting each of the perturbation patterns includes performing a proximity correction.

3. The method according to claim 1, wherein predicting the first patterns is performed in consideration of a predetermined error factor including a proximity effect.

4. The method according to claim 1, wherein generating the plurality of the perturbation patterns includes:
   dividing, into a plurality of line segments, a peripheral line of the pattern included in said part of the pattern layout; and
   moving a desired one of the line segments.

5. The method according to claim 1, wherein generating the plurality of the perturbation patterns includes enlarging or reducing the pattern included in said part of the pattern layout.

6. The method according to claim 1, wherein generating the plurality of the perturbation patterns includes:
   dividing, into a plurality of portions, the pattern included in said part of the pattern layout; and
   moving a desired one of the portions.

7. The method according to claim 1, wherein:
   generating the plurality of the perturbation patterns includes perturbing a particular portion of the pattern included in said part of the pattern layout; and
   acquiring the first differences includes acquiring a difference between the perturbation pattern and the first pattern for the particular portion and a portion near the particular portion.

8. A method of manufacturing a mask, comprising forming, on a mask substrate, a mask pattern based on the pattern obtained by the method according to claim 1.

9. A method of manufacturing a semiconductor device, comprising projecting, onto a wafer, the pattern obtained by the method according to claim 1.

10. A computer readable non-transitory medium configured to store program instructions for causing a computer to:
    extract part of a pattern layout of a design pattern of a semiconductor device;
    perturb a pattern included in said part of the pattern layout by moving an edge of said pattern to generate a plurality of perturbation patterns;
    correct each of the perturbation patterns;
    predict first patterns, to be formed on a wafer, from the corrected perturbation patterns;
    acquire first differences between the perturbation patterns and the first patterns; and
    correct the pattern included in said part of the pattern layout based on one of the perturbation patterns that satisfies a predetermined condition concerning the first differences.

* * * * *